United States Patent
Saxod et al.

(10) Patent No.: US 10,177,098 B2
(45) Date of Patent: Jan. 8, 2019

(54) METHOD FOR FABRICATING AN ELECTRONIC DEVICE AND A STACKED ELECTRONIC DEVICE

(71) Applicant: STMicroelectronics (Grenoble 2) SAS, Grenoble (FR)

(72) Inventors: Karine Saxod, Les Marches (FR); Marika Sorrieul, Montaud (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 67 days.

(21) Appl. No.: 15/410,230

(22) Filed: Jan. 19, 2017

(65) Prior Publication Data

US 2017/0133520 A1    May 11, 2017

Related U.S. Application Data

(62) Division of application No. 14/821,902, filed on Aug. 10, 2015, now Pat. No. 9,773,740.

(30) Foreign Application Priority Data

Nov. 26, 2014   (FR) .................................. 14 61471

(51) Int. Cl.
   *H01L 21/56*     (2006.01)
   *H01L 23/00*     (2006.01)
   (Continued)

(52) U.S. Cl.
   CPC ............ *H01L 23/562* (2013.01); *H01L 21/56* (2013.01); *H01L 23/315* (2013.01);
   (Continued)

(58) Field of Classification Search
   CPC .. H01L 2224/30135; H01L 27/146–27/14893;
   H01L 31/0203;
   (Continued)

(56) References Cited

U.S. PATENT DOCUMENTS 6,020,219 A    2/2000  Dudderar et al.
6,492,699 B1 *  12/2002  Glenn ............... H01L 27/14618
                                                    257/433

(Continued)

FOREIGN PATENT DOCUMENTS

EP          1596438 A2    11/2005
JP          2011114054 A   6/2011
WO      WO-2010109703 A1   9/2010

OTHER PUBLICATIONS

INPI Search Report and Written Opinion for FR 1461471 dated Jun. 30, 2015 (9 pages).

*Primary Examiner* — Kevin Parendo
(74) *Attorney, Agent, or Firm* — Crowe & Dunlevy

(57) ABSTRACT

A method for fabricating an electronic device includes fixing a rear face of an integrated-circuit chip to a front face of a support wafer. An infused adhesive is applied in the form of drops or segments that are separated from each other. A protective wafer is applied to the infused adhesive, and the infused adhesive is cured. The infused adhesive includes a curable adhesive and solid spacer elements infused in the curable adhesive. A closed intermediate peripheral ring is deposited on the integrated-circuit chip outside the cured infused adhesive, and an encapsulation block is formed such that it surrounds the chip, the protective wafer and the closed intermediate peripheral ring.

13 Claims, 6 Drawing Sheets

(51) Int. Cl.
*H01L 23/31* (2006.01)
*H01L 27/146* (2006.01)
*H01L 31/02* (2006.01)
*H01L 31/0203* (2014.01)
*H01L 31/18* (2006.01)

(52) U.S. Cl.
CPC ...... *H01L 23/3121* (2013.01); *H01L 23/3171* (2013.01); *H01L 24/17* (2013.01); *H01L 24/29* (2013.01); *H01L 24/30* (2013.01); *H01L 24/32* (2013.01); *H01L 24/73* (2013.01); *H01L 24/81* (2013.01); *H01L 24/97* (2013.01); *H01L 27/14618* (2013.01); *H01L 27/14683* (2013.01); *H01L 31/0203* (2013.01); *H01L 31/02005* (2013.01); *H01L 31/1876* (2013.01); H01L 24/48 (2013.01); H01L 2224/1329 (2013.01); H01L 2224/13291 (2013.01); H01L 2224/14179 (2013.01); H01L 2224/2929 (2013.01); H01L 2224/29291 (2013.01); H01L 2224/30135 (2013.01); H01L 2224/32225 (2013.01); H01L 2224/48227 (2013.01); H01L 2224/73203 (2013.01); H01L 2224/81862 (2013.01); H01L 2224/81874 (2013.01); H01L 2924/00014 (2013.01); H01L 2924/15311 (2013.01); H01L 2924/16235 (2013.01); H01L 2924/181 (2013.01)

(58) Field of Classification Search
CPC .................................. H01L 2224/14179; H01L 2224/1329–2224/13291; H01L 2224/32225; H01L 2224/16225; H01L 2224/2919–2224/29191; H01L 2224/73203; H01L 2224/14517; H01L 2224/17517
See application file for complete search history.

(56) References Cited

U.S. PATENT DOCUMENTS

| | | | |
|---|---|---|---|
| 6,544,371 | B2 | 4/2003 | Senoo et al. |
| 7,675,180 | B1 | 3/2010 | St Amand et al. |
| 2003/0098912 | A1 | 5/2003 | Hosokai et al. |
| 2006/0043555 | A1 | 3/2006 | Liu |
| 2006/0100299 | A1 | 5/2006 | Malik et al. |
| 2007/0080467 | A1 | 4/2007 | Kurita |
| 2008/0023809 | A1 | 1/2008 | Wu et al. |
| 2008/0217772 | A1 | 9/2008 | Watanabe |
| 2008/0296718 | A1 | 12/2008 | Kumata et al. |
| 2009/0213262 | A1 | 8/2009 | Singh et al. |
| 2009/0267170 | A1 | 10/2009 | Chien et al. |
| 2011/0180893 | A1 | 7/2011 | Minegishi et al. |
| 2011/0227173 | A1 | 9/2011 | Seppala et al. |
| 2012/0133042 | A1* | 5/2012 | Hayashi ................ B81B 7/0048 257/737 |
| 2012/0147489 | A1 | 6/2012 | Matsuoka |
| 2012/0159118 | A1 | 6/2012 | Wong et al. |
| 2015/0070864 | A1 | 3/2015 | Rainer et al. |
| 2015/0364455 | A1 | 12/2015 | Crobu et al. |

\* cited by examiner

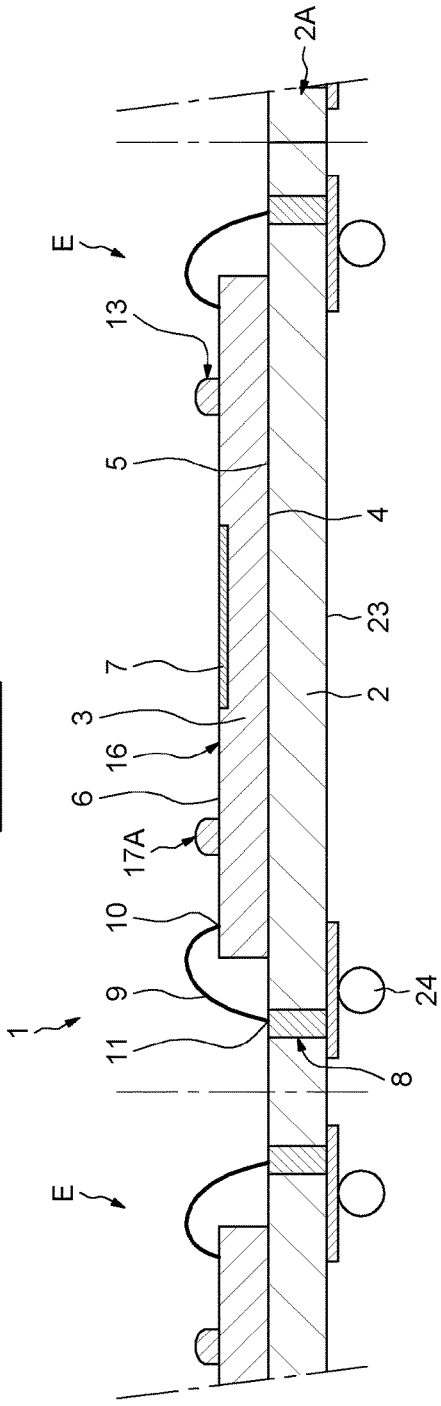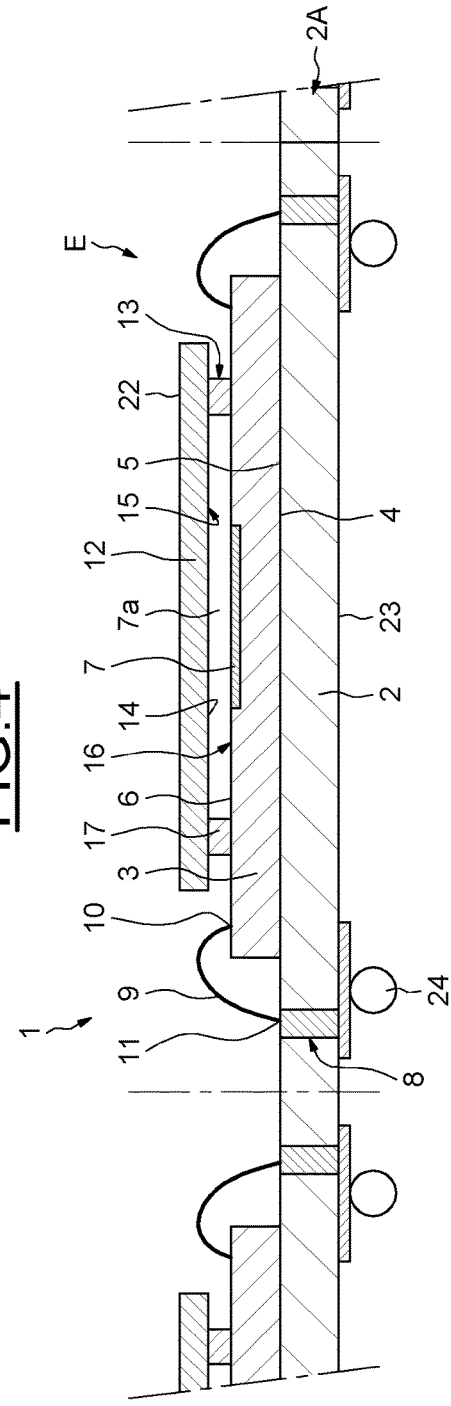

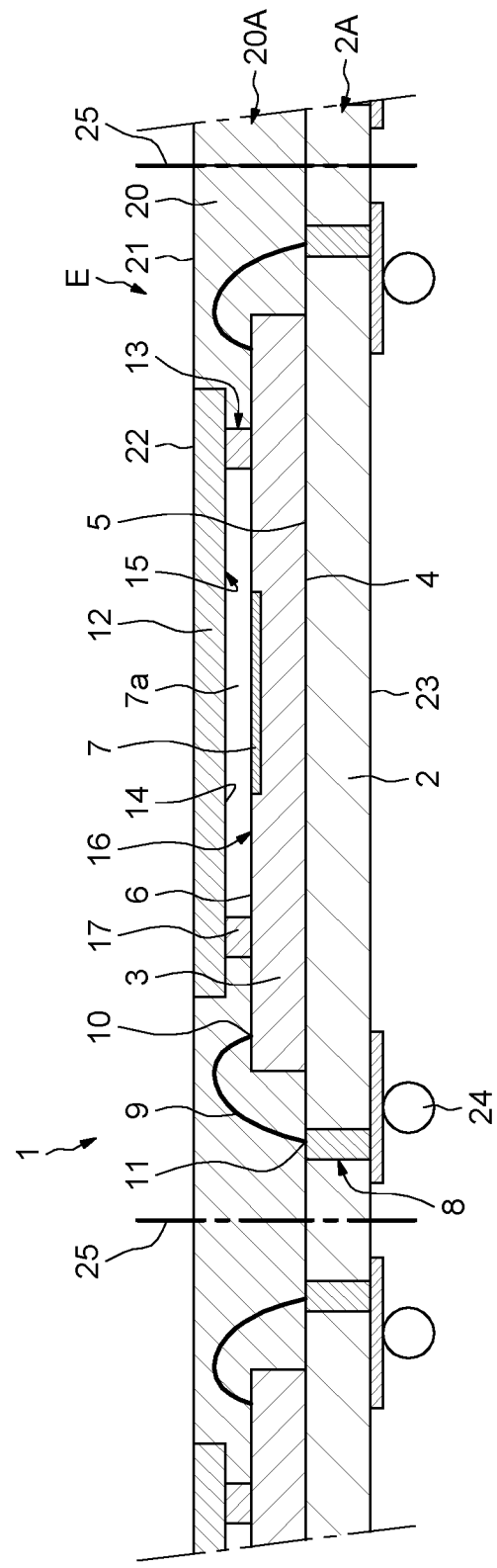

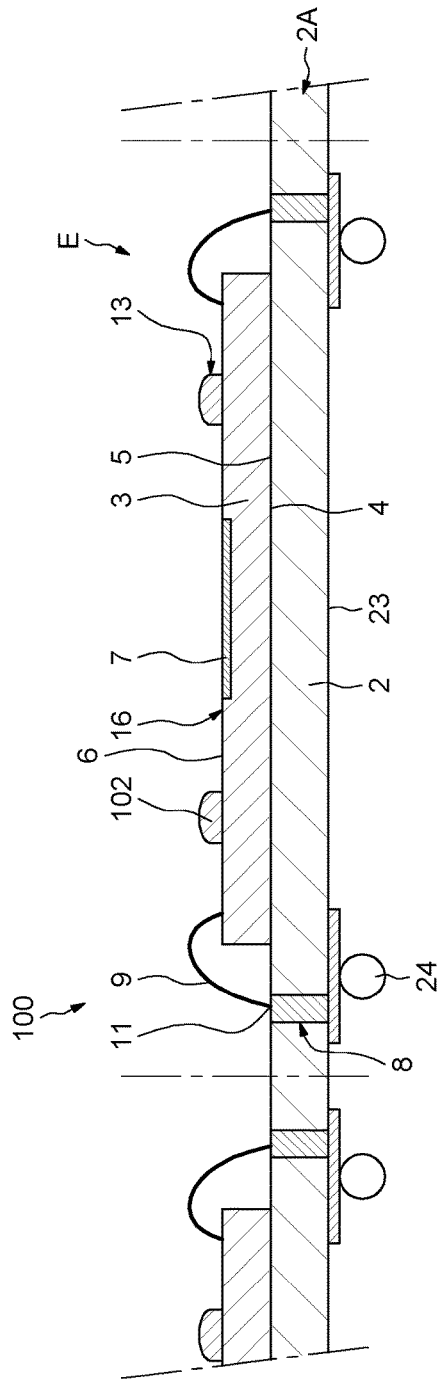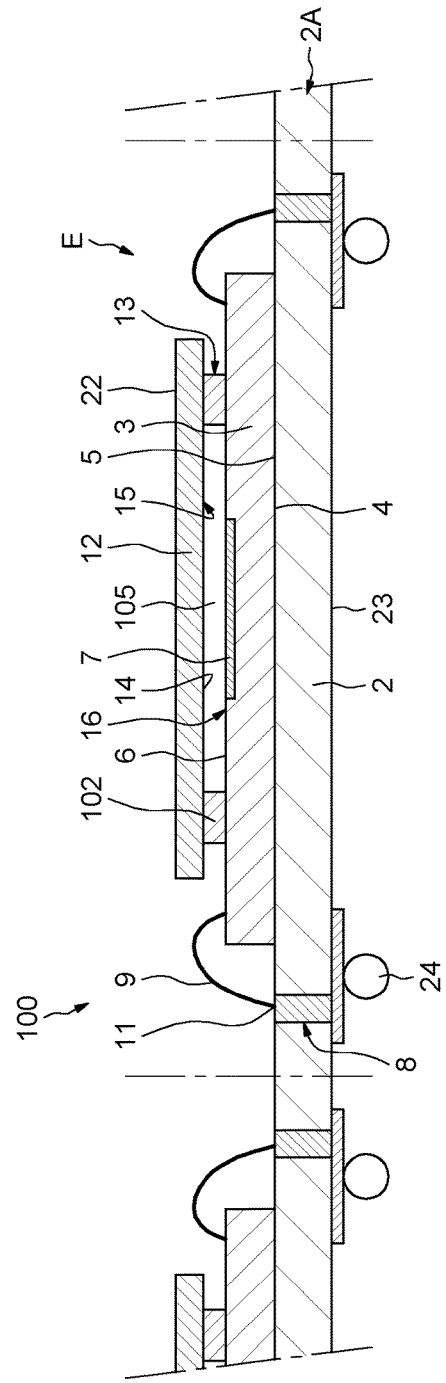

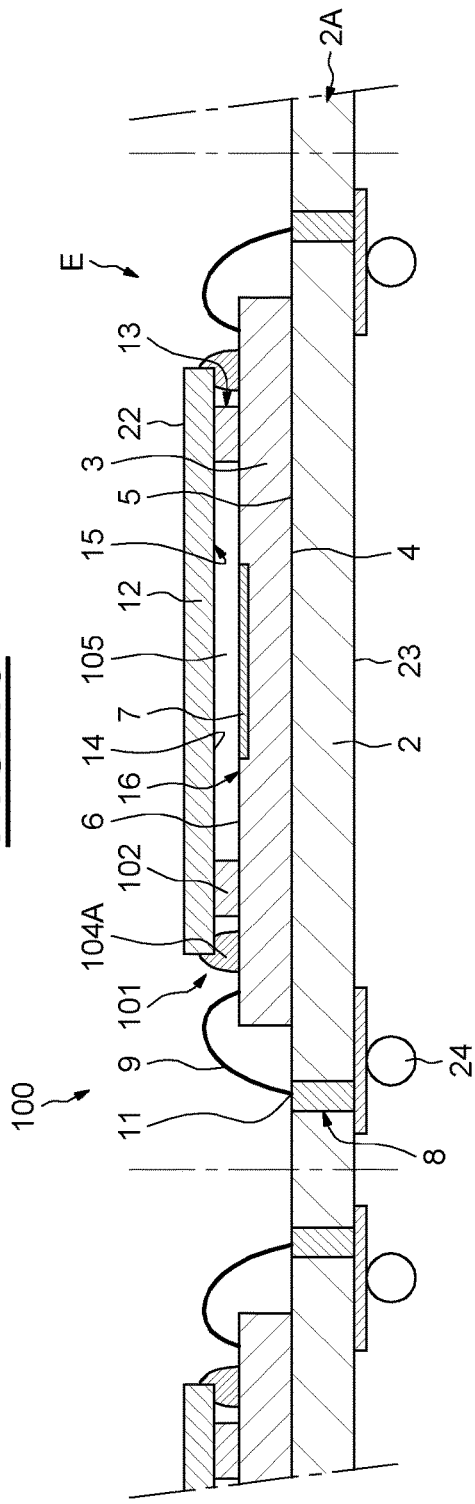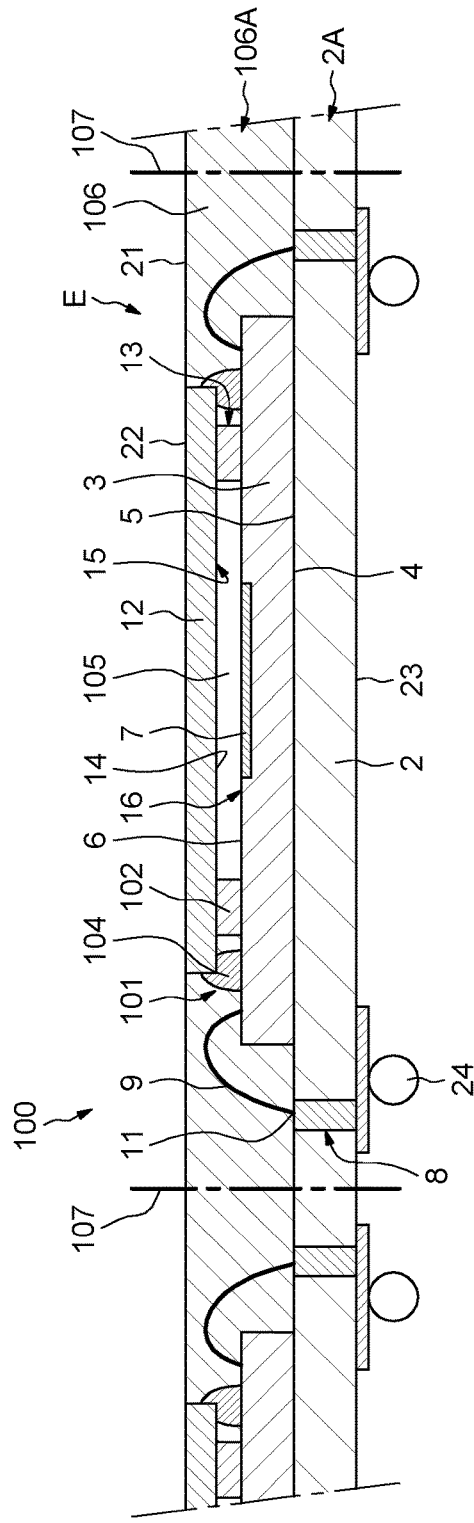

METHOD FOR FABRICATING AN ELECTRONIC DEVICE AND A STACKED ELECTRONIC DEVICE

CROSS REFERENCE TO RELATED APPLICATION

This application is a divisional of U.S. patent application Ser. No. 14/821,902 filed on Aug. 10, 2015, now pending, which claims the priority benefit of French Patent Application No. 1461471 filed on Nov. 26, 2014, the content of each is hereby incorporated by reference in its entirety to the maximum extent allowable by law.

TECHNICAL FIELD

The present invention relates to the field of electronic devices and particularly to electronic devices including integrated-circuit chips.

BACKGROUND

According to one known embodiment, an electronic device includes, in a stacked configuration, a support wafer, an integrated-circuit chip mounted on a front face of this support wafer and including a sensor in its front face, and a protective wafer mounted above this front face. This stack is generally surrounded by an encapsulation block.

Particularly in the case in which the sensor is an optical sensor located on the same side as the protective wafer, selected to be made of a transparent material, for example glass, there are attendant difficulties for obtaining a free and leaktight space between the front face of the chip and the protective wafer.

SUMMARY

One embodiment provides a method for fabricating at least one electronic device that includes a support wafer, an integrated-circuit chip, and a protective wafer in a stacked configuration.

This method includes fixing a rear face of the chip on a front face of the support wafer; and depositing an infused adhesive on a zone of the front face of the chip lying outside a central region of this front face. The infused adhesive includes a curable adhesive and solid spacer elements that are infused in the curable adhesive. The protective wafer is placed on the infused adhesive so that a free space remains between the chip and the protective wafer. The curable adhesive is cured so as to fix the chip and the protective wafer together, and the deposited infused adhesive defines at least one passage to the free space. An encapsulation ring is produced around the chip and the protective wafer and on a peripheral zone of the front face of the support wafer. The encapsulation ring is separated from the free space by an obstruction barrier. In one embodiment, the obstruction barrier is formed by the infused adhesive. In another embodiment, the obstruction barrier is formed by an intermediate peripheral ring that is produced after the infused adhesive is cured.

In one embodiment, the infused adhesive is configured in the form of an annular bead surrounding the central region and having end portions located at a distance from one another, so as to form the passage between them, this annular bead forming the obstruction barrier after curing the curable adhesive.

In another embodiment, the infused adhesive is configured in the form of drops or segments at a distance from one another. An obstruction barrier is produced in the form of an intermediate peripheral ring between the chip and the protective wafer, after curing of the adhesive of the infused adhesive and before production of the encapsulation ring.

In order to produce the encapsulation ring a coating material is supplied, and this coating material is cured.

The curable adhesive of the infused adhesive may be a material capable of curing under the effect of heat.

The intermediate peripheral ring may be made of a material capable of curing under the effect of ultraviolet radiation.

One embodiment also provides an electronic device, which includes: a support wafer having a front face; an integrated-circuit chip having a rear face fixed on the front face of the support wafer; a protective wafer located facing and at a distance from the front face of the chip. An infused adhesive is interposed between the chip and located on a zone of the front face of the chip outside a central region of this front face. This infused adhesive includes a curable adhesive and solid spacer elements infused in the curable adhesive. An obstruction barrier is arranged between the chip and the protective wafer, outside the central region of the front face of the chip, and an encapsulation ring surrounds the chip, the protective wafer and the obstruction barrier.

The infused adhesive may be in the form of an annular bead having end portions extending at a distance from one another where this annular bead forms the obstruction barrier.

In an alternate embodiment, the infused adhesive may be in the form of drops or segments at a distance from one another, and the obstruction barrier is in the form of a peripheral ring arranged between the chip and the protective wafer.

The chip may include a sensor located in the region of its front face.

The sensor may be an optical sensor and the protective wafer may be transparent.

BRIEF DESCRIPTION OF THE DRAWINGS

Electronic devices will now be described by way of nonlimiting examples illustrated by the drawings, in which:

FIGS. 3-5 represent cross sections of assemblies corresponding to fabrication steps of the electronic device of FIG. 1;

FIGS. 8-11 represent cross sections of assemblies corresponding to fabrication steps of the electronic device of FIG. 6.

DETAILED DESCRIPTION

Figure 1:
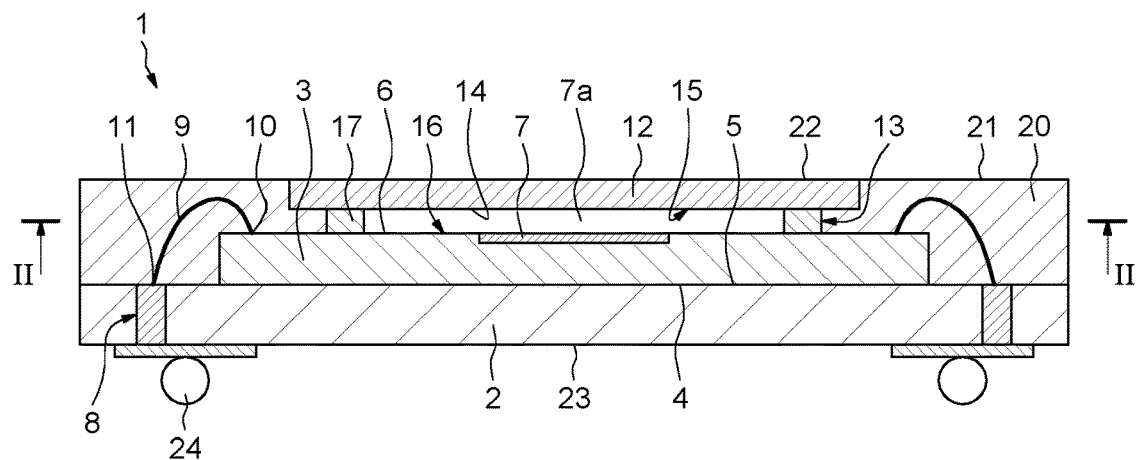
FIG. 1 represents a cross section of an electronic device including a chip and a protective wafer.
Figure 2:
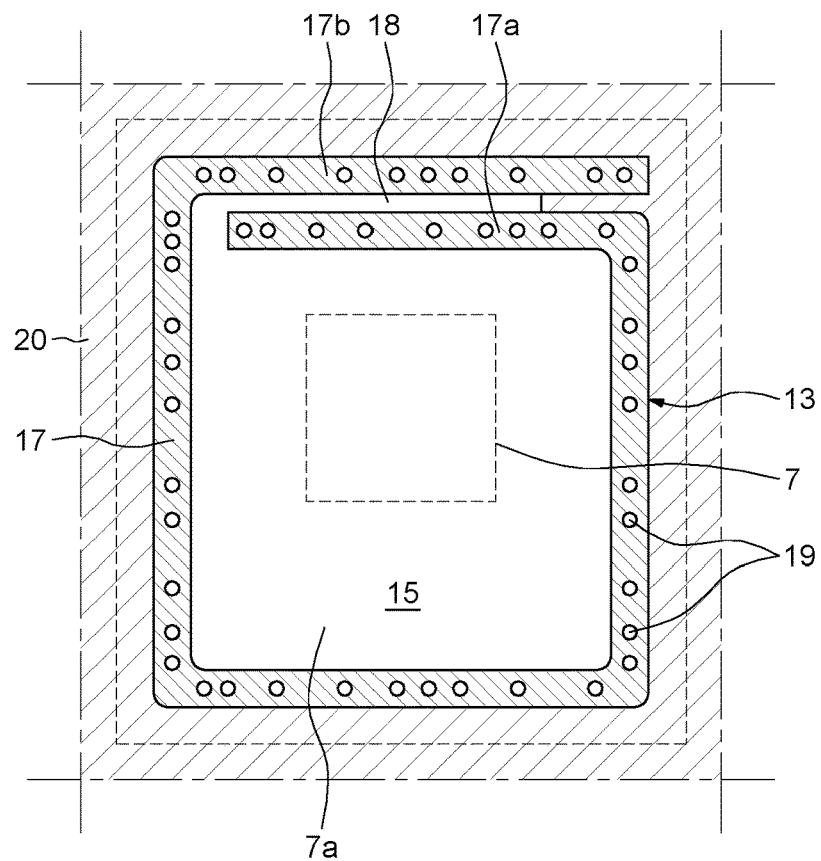
FIG. 2 represents a plan section of the electronic device along II-II of FIG. 1, passing between the chip and the protective wafer.

As illustrated in FIGS. 1 and 2, an electronic device 1 includes a support and electrical connection wafer 2 and an integrated-circuit chip 3, a rear face 4 of which is mounted on a front face 5 of the support wafer 2 using a thin layer of adhesive. The surface area of the, for example square-shaped, rear face 4 is smaller than the surface area of the, for example square-shaped, front face 5. The chip 3 is mounted in the middle of the support wafer 2, with the peripheral edges of the chip 3 being parallel to the peripheral edges of the support wafer 2.

In the central zone of a front face 6 of the chip 3, the chip 3 includes a sensor 7, for example an optical sensor.

The support wafer 2 is provided with an electrical connection network 8. The chip 3 is connected to this electrical connection network 8 by means of a plurality of electrical connection wires 9 which connect front pads 10, which are arranged on a peripheral zone of the front face 6 of the chip 3, and front pads 11 of the electrical connection network 8, which are arranged on a peripheral zone of the front face 5 of the support wafer 2, between the peripheral edge of the chip 3 and the peripheral edge of the support wafer 2.

The electronic device 1 furthermore includes a protective wafer 12, which is generally transparent and which is stacked on the chip 3 and fixed at a distance from the front face 6 of the chip 3 by means of an adhesive that secures the protective wafer 12 to the chip 3. In certain embodiments, the adhesive is an infused adhesive 13, but other techniques for securing the protective wafer 12 to the chip 3 that are known in the art are contemplated by the present disclosure. The peripheral edges of the protective wafer 12 extend parallel to the peripheral edges of the chip 3, inside the peripheral zone of the chip 3 including the electrical connection pads 10.

The infused adhesive 13 extends between and at a distance from the sensor 7 and front pads 10 of the front face 6 of the chip 3 and on a peripheral zone of a rear face 14 of the protective wafer 12, so that the front face 6 of the chip 3 has a central region 15, including the sensor 7, located facing and at a distance from a central region 16 of the rear face 14 of the protective wafer 12 while leaving a free space 7a remaining between these regions 15 and 16.

The infused adhesive 13 includes an annular bead 17 of adhesive forming a strut, which extends in the form of an open ring surrounding the central region of the front face of the chip and has end portions 17a and 17b extending next to one another and at a distance from one another, while leaving a passage 18 remaining between these end portions 17a and 17b.

The adhesive bead 17 includes solid spacer elements 19, for example glass or plastic beads.

The electronic device 1 furthermore includes an encapsulation ring 20 made of a coating material, which extends around the peripheral edges of the chip 3 and of the protective wafer 12 and on the peripheral zone of the front face 5 of the support wafer 2, and in which the electrical connection wires 9 are embedded.

As represented by way of example, the encapsulation ring 20 extends between the chip 3 and the protective wafer 12, as far as the adhesive bead 17 and optionally between its portions 17a and 17b, but without reaching the free space 7a. Thus, the discontinuous bead 17 secures the protective wafer 12 to the chip 3 and constitutes an obstruction barrier for the free space 7a.

Thus, the free space 7a is protected in particular from moisture and from any ingress of solid particles, and the sensor 7 is therefore protected.

According to the example represented, the encapsulation ring 20 has a front face 21 which extends in the same plane as the front face 22 of the protective wafer 12.

The peripheral edges of the support wafer 2 and of the encapsulation block 20 may extend in continuation of one another, perpendicularly to the support wafer 2, so that the electronic device 1 is in the form of a right-angled parallelepiped.

The rear face 23 of the support wafer 2 may be provided with electrical connection elements 24 placed on rear pads of the connection network 8.

Referring to FIGS. 3-5, a way of fabricating the electronic device 1 will now be described.

As illustrated in FIG. 3, with a view to collective fabrication, a panel 2A is provided, which has in the form of a square matrix a plurality of adjacent locations E, in each of which it is provided with an electrical connection network 8.

An integrated-circuit chip 3 is put in place by transfer and fixed on each of the locations E of the panel 2A, in the position described above, by means of a thin layer of adhesive.

The connection wires 9 are then put in place, as described above.

Then, for example by means of a dispensing needle, beads 17A of a curable adhesive including solid spacer elements 19 are extended respectively on the front faces 6 of the chips 3 which have been put in place, along lines corresponding to the beads 17 to be produced, as described above. This adhesive is a so-called thermal adhesive, that is to say it is capable of being cured under the effect of heat, by baking. It may be selected from suitable epoxy resins.

Next, as illustrated in FIG. 4, protective wafers 12 are put in place respectively above the beads 17A, while squeezing them slightly.

By virtue of the presence of the solid spacer elements 19 in the adhesive, the existence and the thickness of the free spaces 7a between the chips 3 and the protective wafers 12 are ensured.

The adhesive beads 17A are then cured in an oven, at a suitable temperature which is not stressful for the sensors 7, so as to obtain the fixing beads 17.

By virtue of the existence of the passages 18 leaving communication between the free spaces 7a and the ambient environment, the gases which are formed, in particular during polymerization of the adhesive, for example curing the adhesive beads 17A, can escape without increasing the pressures in the free spaces 7a.

According to an alternative embodiment, the electrical connection wires 9 could be put in place after the protective wafers 12 are put in place.

Next, as illustrated in FIG. 5, a layer 20A is produced in the area separating the stacks of chips 3 and the protective wafers 12, on the corresponding zones of the front face of the support panel 2A. For example, the layer 20A may be produced by spreading a liquid material such as a suitable epoxy resin, or by injection into a mold, one face of which bears on the front faces of the protective wafers 12.

This material is then cured, for example by baking in an oven, so as to form an encapsulation ring 20 as described above in each of the locations E.

The electrical connection beads 24 are then put in place.

Lastly, the electronic devices 1 obtained in each location E are divided up, or separated, by sawing the panel 2A and the layer 20A along the separation lines 25 of the locations E.

Figure 6:
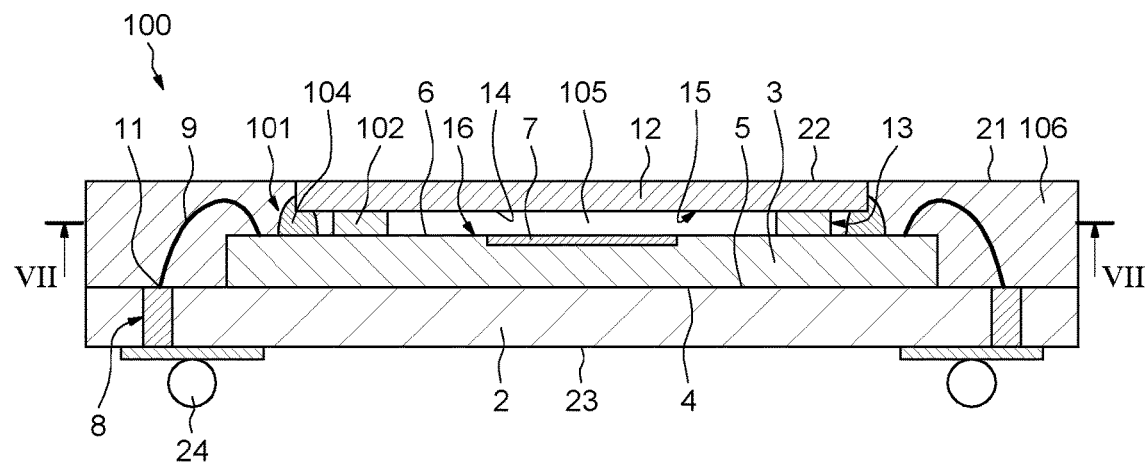
FIG. 6 represents a cross section of an alternative embodiment of an electronic device including a chip and a protective wafer.
Figure 7:
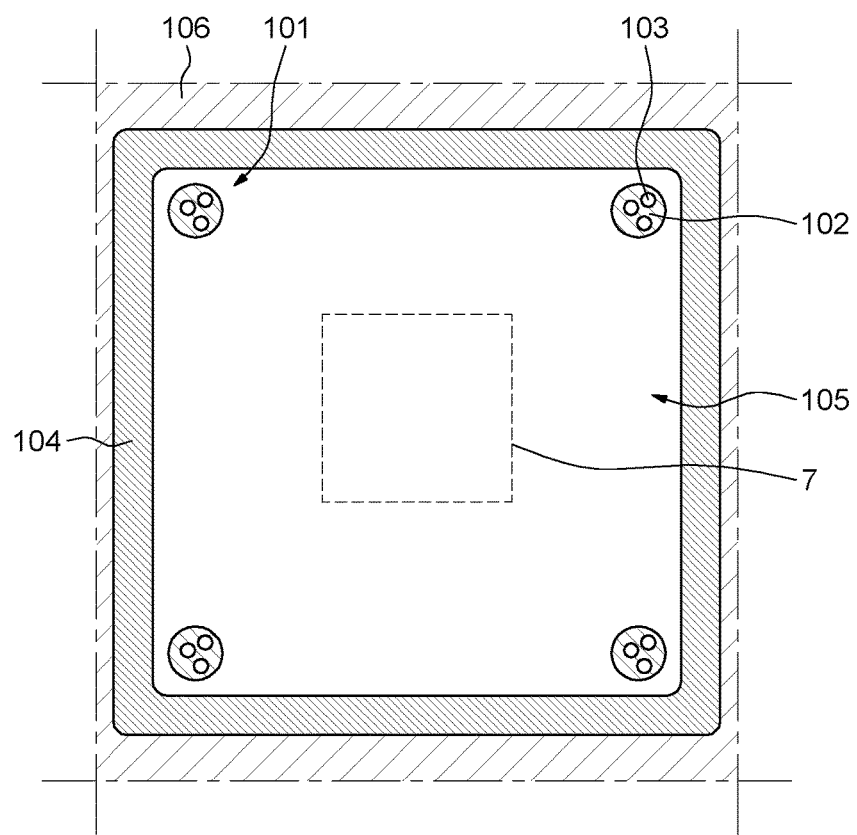
FIG. 7 represents a plan section of the electronic device along VII-VII of FIG. 6, passing between the chip and the protective wafer.

As illustrated in FIGS. 6 and 7, an electronic device 100 is distinguished from the electronic device 1, described with reference to FIGS. 1 and 2, by the fact that owing to replacement of the infused adhesive 13, it includes a different infused adhesive 101 for the mounting of the protective wafer 12 on the chip 3.

According to this exemplary embodiment, this infused adhesive 101 includes a plurality of drops of adhesive 102, forming a strut, including solid spacer elements 103 and spaced apart. For example, four points of adhesive 102 may be provided between opposing corner zones of the faces 6 and 14 of the chip 3 and of the protective wafer 12, outside and at a distance from the central region including the sensor 7. The drops of adhesive are represented as being round, although they could be elongate in the form of segments.

Furthermore, an obstruction barrier is in the form of a continuous closed intermediate peripheral ring 104 which obstructs the periphery of the space separating the chip 3 and the protective wafer 12. This intermediate peripheral ring 104 is formed on the front face 6 of the chip 3 and along the peripheral edge of the protective wafer 12.

Thus, in an equivalent way to the previous example, the free space 105 formed between the faces 6 and 14 of the chip 3 and of the protective wafer 12, and surrounded by the intermediate peripheral ring 104, is closed and protected.

According to this embodiment, in an equivalent way to the previous example, the electronic device 100 includes an encapsulation ring 106 made of a coating material, which extends around the peripheral edges of the chip 3 and of the protective wafer 12, around the intermediate peripheral ring 104 and on the peripheral zone of the front face 5 of the support wafer 2, and in which the electrical connection wires 9 are embedded.

Referring to FIGS. 8 to 11, a way of fabricating the electronic device 100 will now be described.

As illustrated in FIG. 8, with a view to collective fabrication, in an equivalent way to the previous example, a panel 2A is provided which has in the form of a matrix a plurality of adjacent locations E, in each of which locations it is provided with an electrical connection network 8.

An integrated-circuit chip 3 is fixed in the position described above on each of the locations E of the panel 2A.

The connection wires 9 are then put in place, as described above.

Next, for example by means of a dispensing needle, drops 102A of an adhesive including solid spacer elements 103 are arranged on the front faces 6 of the chips 3 which have been put in place, at the positions of the drops 102 to be produced, as indicated above. As in the previous example, this adhesive may be a thermal adhesive capable of being cured under the effect of heat, for example a suitable epoxy resin.

Next, as illustrated in FIG. 9, protective wafers 12 are put in place respectively above the drops 102A, at the locations E, while squeezing them slightly.

By virtue of the existence of the solid spacer elements 103, the existence and the thickness of the free spaces 105 between the chips 3 and the protective wafers 12 are ensured.

The drops of adhesive 102A are then cured in an oven, at a suitable temperature which is not stressful for the sensors 7.

By virtue of the existence of the spaces separating the drops 102A, the gases which are formed, in particular during polymerization of the adhesive, for example curing the drops of adhesive 102A, can escape without generating pressure in the free space 105.

Next, as illustrated in FIG. 10, for example with the aid of a dispensing needle, intermediate peripheral rings 104A are formed from a coating material around the stacks, between the chips 3 and the protective wafers 12 and at the periphery of the free spaces 105, that is to say at the positions corresponding to the closed intermediate rings 104 to be produced, as described above. This coating material is a material capable of being cured under the effect of ultraviolet radiation, without elevation of the temperature and without the release of gas. It may be a suitable epoxy resin. The rings 104A are then cured in order to form the intermediate rings 104, for example under the effect of ultraviolet radiation.

Next, as illustrated in FIG. 11 and in an equivalent way to the previous example with reference to FIG. 5, a layer 106A is produced in the area separating the stacks of chips 3 and protective wafers 12 and the corresponding zones of the front face of the support panel 2A. The material constituting this layer 106A is prevented from penetrating into the free spaces 105 because of the existence of the closed intermediate peripheral rings 104.

This material is then cured so as to form an encapsulation block 106 in each of the locations E.

The electrical connection beads 24 are then put in place.

Lastly, the electronic devices 100 obtained in each location E are divided up by sawing the panel 2A and the layer 106A along the lines 107 of the matrix of locations E.

According to an alternative embodiment, the support wafer 2 could be replaced with a chip including an electronic circuit for processing the signals coming from the chip 3.

The present invention is not limited to the examples described above. In particular, with the aim described above of positioning the protective wafer at a distance from the chip provided with an optical sensor, removal of the gases appearing during curing of the bonding material and leak-tight encapsulation of the space separating the chip provided with an optical sensor and the protective wafer, mounting means having different shapes and different arrangements, based on those described above, could be provided. Other alternative embodiments are possible without departing from the scope of the invention.

The invention claimed is:

1. A method for fabricating an electronic device, comprising:
    fixing a rear face of an integrated-circuit chip on a front face of a support wafer;
    depositing on a front face of the integrated-circuit chip an infused adhesive in a plurality of drops or segments separated from each other outside a central region of the front face of the integrated-circuit chip, the infused adhesive comprising a curable adhesive and solid spacer elements infused in the curable adhesive;
    placing a protective wafer on the infused adhesive so that a free space remains between the front face of the integrated-circuit chip and the protective wafer;
    curing the infused adhesive to fix the protective wafer to the integrated-circuit chip;
    depositing a closed intermediate peripheral ring on the integrated-circuit chip outside of the cured infused adhesive; and
    producing on a peripheral zone of the front face of the support wafer an encapsulation block around the integrated-circuit chip, the protective wafer, and the closed intermediate peripheral ring.

2. The method of claim 1 wherein curing the infused adhesive comprises exposing the infused adhesive to heat to polymerize the curable adhesive and thereby release gas.

3. The method of claim 2 wherein the curable adhesive comprises an epoxy resin.

4. The method of claim 1 further comprising curing the closed intermediate peripheral ring.

5. The method of claim 4 wherein curing the closed intermediate peripheral ring comprises exposing the closed intermediate peripheral ring to ultraviolet radiation, the curing of the closed intermediate peripheral ring occurring without releasing gas.

6. The method of claim 1 wherein the closed intermediate peripheral ring is deposited at least partially outside the protective wafer.

7. The method of claim 1 further comprising wire bonding front pads of the integrated-circuit chip to an electrical connection network associated with the support wafer.

8. The method of claim 1 wherein producing the encapsulation block comprises spreading an epoxy resin.

9. The method of claim 1 wherein producing the encapsulation block comprises injection molding a liquid material.

10. The method of claim 1 wherein the infused adhesive is deposited using a dispensing needle.

11. The method of claim 1 wherein the closed intermediate peripheral ring is deposited using a dispensing needle.

12. The method of claim 1 wherein the integrated-circuit chip is applied to the support wafer with a thin layer of adhesive.

13. The method of claim 1 further comprising cutting through the support wafer and the encapsulation block to form the electronic device.

* * * * *